United States Patent
Liu et al.

(10) Patent No.: US 8,467,999 B2
(45) Date of Patent: Jun. 18, 2013

(54) METHOD OF THREE-DIMENSIONAL OPTIMIZATION DESIGN FOR ASYMMETRIC CUSP MAGNETIC FIELD IN MCZ SINGLE CRYSTAL FURNACE

(75) Inventors: Ding Liu, Xi'an Shaanxi (CN); Shangbin Jiao, Xi'an Shaanxi (CN); Yingmin Yi, Xi'an Shaanxi (CN)

(73) Assignee: Xi'an University of Technology, Xi'an Shaanxi (CN)

( * ) Notice: Subject to any disclaimer, the term of this patent is extended or adjusted under 35 U.S.C. 154(b) by 233 days.

(21) Appl. No.: 12/951,481

(22) Filed: Nov. 22, 2010

(65) Prior Publication Data
US 2012/0035893 A1 Feb. 9, 2012

(30) Foreign Application Priority Data
Aug. 9, 2010 (CN) .......................... 2010 1 0257476

(51) Int. Cl.
G06F 7/60 (2006.01)
G06F 17/10 (2006.01)
G06G 7/48 (2006.01)

(52) U.S. Cl.
USPC .................................................. 703/2; 703/7

(58) Field of Classification Search
USPC ......................................................... 703/2, 7
See application file for complete search history.

(56) References Cited

U.S. PATENT DOCUMENTS

2009/0321417 A1 * 12/2009 Burns et al. ................... 219/542

* cited by examiner

Primary Examiner — David Silver
(74) Attorney, Agent, or Firm — NSIP Law

(57) ABSTRACT

A method of three-dimensional optimization design for an asymmetric cusp magnetic field in an MCZ single crystal furnace is disclosed. An optimization design for structural parameters of the magnetic field includes first establishing a three-dimensional magnetic model by using ANSYS software, varying parameters of the model, determining a span between upper and lower parts of coils, determining a number of transverse turns of the coils and the thickness of a shield. An optimization design for specification parameters of the coils of the magnetic field includes determining a relationship between heat and specification parameters of the coils and between heat transfer of the coils at their copper pipe walls and the specification parameters of the coils, analyzing heat absorbed by cooling water, establishing an optimization model of a system, and optimizing the specification parameters of the coils of the magnetic field using the ANSYS software.

1 Claim, 7 Drawing Sheets

METHOD OF THREE-DIMENSIONAL OPTIMIZATION DESIGN FOR ASYMMETRIC CUSP MAGNETIC FIELD IN MCZ SINGLE CRYSTAL FURNACE

CROSS-REFERENCE TO RELATED APPLICATION(S)

This application claims the benefit under 35 U.S.C. §119 (a) of Chinese Patent Application No. 201010257476.5, filed on Aug. 9, 2010, in the State Intellectual Property Office of the People's Republic of China, the entire disclosure of which is incorporated herein by reference for all purposes.

FIELD OF THE INVENTION

The present invention belongs to a technical filed of crystal growth in a single crystal furnace, particularly, relates to a method of three-dimensional optimization design for an asymmetric cusp magnetic field in an MCZ single crystal furnace.

DESCRIPTION OF RELATED ART

A Czochralski (CZ) method is an important method for industrially producing single crystal silicon. On the one hand, as crystals have increased diameters, a crucible has an increased diameter correspondingly, and the heating power thereof is in turn increased. A big quartz crucible can bear a higher temperature than a small quartz crucible, in which thermal convention in the melt is intensified and the reaction of the big quartz crucible and the melt silicon is intensified, thereby generating more SiO. However, a concentration of oxygen is one of the important factors to determine the quality of silicon sheet, in particular, excessive oxygen in the crystal growth may result in heat-induced defects such as dislocation loop, oxygen precipitation or the like. On the other hand, the development of the super large scale integrated circuit has stricter demands on the quality of the crystal, e.g., reduced defects and impurity content in a single crystal material, and improved uniformity of impurities such as oxygen, carbon and the like and dopants distributed in the crystal. The concentration and uniformity of oxygen in the crystal is closely related to a flowing status of the melt. Applying magnetic field in a crystal growth apparatus is an effective method for reducing strong convection within the melt during the growth of large diameter single crystal silicon. A study has found that a longitudinal magnetic field breaks up the symmetry of transverse thermal convection as originally in a CZ growth system, while a transverse magnetic field breaks up the symmetry of axial thermal convection as originally in a CZ growth system, both of which cause growth striations in single crystal rod to become more serious. Therefore, an effective scheme to resolve the above problems is to achieve a cusp magnetic field with non-uniform magnetic force lines distributed therein.

On the one hand, as the crystal grows more and more large (with a diameter $(\Phi) \geq 300$ mm), causing an increased diameter of a furnace and coils in a magnetic field to be far away from a wall of a crucible, magnetic intensity of an inner wall of the crucible becomes smaller in the case that electric current and a structure of coils in a magnetic field are determined; on the other hand, in order to meet the requirements of the very large scale integrated circuit on crystal quality to effectively suppress the convection of the melt, it is required that a radial component of magnetic induction intensity at the inner wall of the crucible should be above Brmin, meanwhile, the wider the region in the crucible satisfying a radial component of $Br \geq Brmin$ and an axial component of $Bz \leq Bzmax$ is, the better the effect of suppressing the flowing of the melt is. Either increasing a total turns of coil or increasing electric current flowing through the coil can enhance the magnetic induction intensity to some extent. However, increasing a total turns of coil may be limited by a body height of a single crystal furnace, and increasing the coil current may cause power consumption of the magnetic field to be rapidly increased (the power consumption of the magnetic field is increased linear with the total turns of coil, and the power consumption of the magnetic field is increased linear with the square of the coil current), resulting in difficulty in cooling the magnetic field. Thus, it is necessary to study how to optimize a structure of magnetic field so as to obtain an optimal effect of suppressing convection, and how to optimize specification parameters of a coil so as to obtain a minimum power consumption of magnetic field.

Since the distribution of the magnetic force lines cannot be influenced by a heater, melt or the like of a single crystal furnace, only a coil and a shield are generally considered upon modeling a cusp magnetic field. Meanwhile, a cusp magnetic field is axially symmetric about an axial center of a single crystal furnace, and it is optimally designed at present by mainly using a two-dimensional finite element modeling. In this method, a magnetic intensity of a certain point in a plane is obtained, and other points at the same height and radius as this point are similarly deemed to have both the same magnetic intensity and the same direction, without considering the effect of an opening of a shield at an outlet of cooling water in the magnetic field on the distribution of the magnetic force lines, so as to simplify constraint conditions. In fact, as for a cusp magnetic field having a relatively small magnetic intensity and including two groups (upper and lower groups) of symmetric coils, the opening of the shield has less influence on the distribution of the magnetic force lines, especially in the melt below a zero-Gauss plane, and thus the two-dimensional modeling method is feasible. However, as for a cusp magnetic field which has a high magnetic intensity and a large diameter, and includes two groups of asymmetric coils with the number of turns of upper and lower groups being small and large, respectively, the opening of the shield has much influence on the distribution of the magnetic force lines, especially in the melt below a zero-Gauss plane, and the magnetic field leakage at the side of the opening is much larger than that of at its opposing side, thus the radial component Br and the axial component Bz of the magnetic intensity at the side of the opening need to be further characterized, and the influence of the opening of the shield on the distribution of the magnetic force lines cannot be reflected by using a planar two-dimensional modeling method, so that it cannot be decided whether the magnetic field distribution at the side of the opening can satisfy the requirements for crystal growth. However, the influence of the structural change of the cusp magnetic field on the distribution of the magnetic force lines and the magnetic intensity can be intuitively analyzed by analyzing each of the points in the magnetic field using a three-dimensional (3D) finite element modeling in consideration of the opening of the shield, so that the designed cusp magnetic field can further meet the requirement of big-sized crystal growth.

SUMMARY OF THE INVENTION

An object of the present invention is to provide a method of three-dimensional optimization design for an asymmetric cusp magnetic field in an MCZ single crystal furnace, in which a model can be relatively similar to an actual magnetic field in consideration of an opening of a shield due to an outlet of cooling water, so that the magnetic structure can be optimized to obtain a high magnetic induction intensity and to meet requirements of a cusp magnetic field for large-size crystal growth, meanwhile specification parameters of coils are optimized to reduce the power of the magnetic field, solving such a problem in the prior art that the influence of the opening of the shield on the distribution of the magnetic force lines cannot be reflected by using a planar two-dimensional modeling method thus whether the magnetic field distribution at the side of the opening can satisfy the requirements for crystal growth cannot be decided.

The technical solution adopted by the present invention is a method of three-dimensional optimization design for an asymmetric cusp magnetic field in an MCZ single crystal furnace, comprising an optimization design for both structural parameters of the magnetic field and specification parameters of coils.

The optimization design for structural parameters of the magnetic field is implemented according to the following steps:

in step 1, establishing a three-dimensional magnetic model by using ANSYS numerical analysis software (a finite element analysis software); and in step 2, varying the parameters of the three-dimensional magnetic model, analyzing the relationship of a magnetic induction intensity of the magnetic field varying with respect to a span between upper and lower parts of coils, the number of transverse turns of coils and a thickness of a shield, determining the span between the upper and lower parts of coils, the number of transverse turns of coils, and the thickness of the shield based on a set magnetic induction intensity of the magnetic field, and under a condition that the magnetic field has a certain power, determining the numbers of longitudinal layers of coils in the upper and lower parts of the magnetic field by taking a common region where the magnetic induction intensity at a solid-liquid interface has both a radial component of Br≧Brmin and an axial component of Bz≦Bzmax being the widest as the optimization object.

The optimization design for specification parameters of the coils is implemented according to the following steps:

in step i, establishing a mathematic expression of heat and cross-section area of the coils as follows, $$w1 = \frac{I^2 l}{s} \rho_0 (1 + at),$$

in the above expression, I refers to a current of the coils powered-on, l refers to a total length of the coils, s refers to a cross-section area of the coils, $\rho_0$ refers to a resistivity at 0° C., a refers to a temperature coefficient of resistivity, and t refers to an actual temperature of copper pipe walls of the coils, establishing a mathematic expression of heat transfer w2 of the coils at the copper pipe walls and a characteristic size de, an average flow velocity V of fluid, and a temperature difference $\Delta t$ between the copper pipe walls and cooling water as follows, $$w2 = 0.023 \frac{\lambda A}{de} \left( \frac{V de}{v} \right)^{0.8} Pr^{0.4} \Delta t,$$

in the above expression, $\lambda$ refers to a heat conductivity of water, de refers to a characteristic size, A refers to a total heat transferring area of the copper pipe walls, V refers to an average flow velocity of fluid, v refers to a kinematic viscosity of the fluid, Pr refers to Prandtl number, $\Delta t$ refers to temperature difference between the copper pipe walls and the cooling water; and establishing a mathematical expression among the amount of heat absorbed by the cooling water w3 and the number of branches of cooling water paths n, a flow amount of the cooling water $q_m$, a specific heat capacity of water c, an outlet water temperature t2, and an inlet water temperature t1 as follows:

$$w3 = q_m c(t2-t1) \cdot n,$$

in the above expression, $q_m$ refers to the flow amount of cooling water, c refers to the specific heat capacity of water, t2 refers to the water temperature at in outlet, t1 refers to the water temperature at an inlet, and n refers to the number of branches of cooling water paths; and in step ii, establishing an optimization model of a system when w1=w2=w3 as follows:

$$\text{objective function: } \min(w1) = \frac{I^2 l}{s} \rho_0 (1 + at),$$

with constraint conditions of $\Delta t + t2 < 40$ and hf<20, wherein $\Delta t + t2$ is the temperature of the copper pipe walls, and hf refers to the liner loss along the coils, and wherein the cross-section area of the coils s, the characteristic size de, the average flow velocity cross-section area of the coil of the fluid V, the temperature difference $\Delta t$ between the copper pipe walls and the cooling water, the number of branches of cooling water paths n, the flow amount of the cooling water $q_m$, the specific heat capacity of water c, the outlet water temperature t2, and the inlet water temperature t1 are obtained by optimizing the specification parameters of the coils in the magnetic field using the ANSYS numerical analysis software.

The features of the present invention further include the followings.

Establishing a three-dimensional magnetic model by using ANSYS numerical analysis software in the step 1 of the optimization design for structural parameters of the magnetic field, which is particularly implemented according to the following steps: defining relevant parameters of a magnetic field at first; allocating unit property and material property of a model, in which air of thin layer inside the magnetic field and magnetic shield are divided by using an entity unit SOLID98, far-field air outside the magnetic field is divided by using INFIN47, and the coils are modeled by using a micro-unit SOURCE36; establishing mesh for each region in an order of shield-air layer-far field, wherein establishing mesh for the shield and the far field by using mapping, and establishing mesh for the air layer by using free mapping; and finally analyzing the solution of the model by applying boundary conditions to the model using a differential scalar potential method among scalar potential methods.

In the step 2 of the optimization design for structural parameters of the magnetic field, determining the span between upper and lower parts of coils based on a set magnetic induction intensity of the magnetic field comprises selecting the span between the upper and lower parts of coils based on a principle that the magnetic induction intensity increases as the thickness of the shield increases, while the increasing rate thereof is increasingly decreased as the thickness of the shield increases.

In the step 2 of the optimization design for structural parameters of the magnetic field, determining the number of transverse turns of coils based on a set magnetic induction intensity of the magnetic field is particularly implemented according to the following steps: the transverse turns of the coils is selected based on a principle that the higher the efficiency is, the better the transverse turns is, in the case that the electric current has a certain value and other structural parameters of the magnetic field are kept unchanged, efficiency per unit ampere turns is calculated by changing the transverse turns of the coils in the magnetic field, and the transverse turns is a multiple of three or four.

In the step 2 of the optimization design for structural parameters of the magnetic field, determining the thickness of the shield based on a set magnetic induction intensity of the magnetic field is particularly implemented according to the following steps: calculating a model simulation, and taking the thickness value where the increasing rate of the magnetic induction intensity is changed to be small from large as an optimization value.

In the step 2 of the optimization design for structural parameters of the magnetic field, determining the numbers of longitudinal layers of coils in the upper and lower parts of the magnetic field is particularly implemented according to the following steps: in the case of a certain power, by changing the numbers of longitudinal layers $N_1$ and $N_2$ respectively in the upper and lower parts of coils and the coil current I, widths of the common regions where the magnetic induction intensity at a solid-liquid interface has both a radial component of $Br \geq Brmin$ and an axial component of $Bz \leq Bzmax$ are calculated, and the parameters $N_1$, $N_2$ and I in the case that the common region is the widest are selected, so that the numbers of the longitudinal layers of coils are determined to be $N_1 * N_2$.

The optimization design method of the present invention has advantageous effect that an inner diameter of the magnetic field is determined according to an outer diameter of a main furnace chamber of a large-sized single crystal furnace, structural parameters of a cusp magnetic field are optimized via a computer by using ANSYS numerical analysis software so as to obtain a radial component of the magnetic induction intensity at the inner wall of the crucible above Brmin, and to make the region below a solid-liquid interface in the crucible which has a radial component of magnetic induction intensity of $Br \geq Brmin$ and an axial component thereof of $Bz \leq Bzmax$ as wide as possible, and to make the power consumption of the magnetic field to be minimum. By using the method of three-dimensional optimization, the influence of the structural variation of the magnetic field on the variation of distribution and intensity of the magnetic field is intuitively revealed in three-dimension in view of all aspects, and the influence of the opening of the shield on the magnetic intensity and magnetic force line so that the designed magnetic field can meet the requirements of the large-sized crystals for the distribution of the magnetic force line, thereby reducing develop period and experiment cost on the cusp magnetic field, and increasing the efficiency of generating magnetic induction intensity by the magnetic field.

Figure 1:
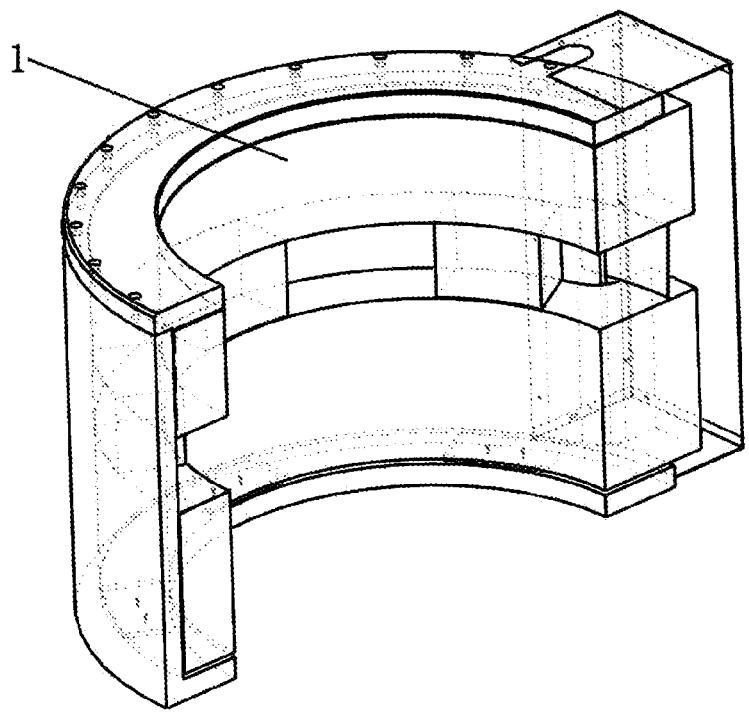
FIG. 1 is a view of a three-dimensional (3D) model for cusp magnetic field according to the present invention.

In the drawings, 1: three-dimensional model for a magnetic field; 2: insulating layer; 3: water-through layer; 4: current-carrying layer; 5: water inlet a; 6: water inlet b; 7: water inlet c; 8: water outlet a; 9: water outlet b; and 10: water outlet c.

DETAILED DESCRIPTION OF THE PREFERRED EMBODIMENTS

Hereinafter, the present invention is explained in detail in conjunction with the attached drawings and specific embodiments.

The present invention directs to a method of three-dimensional (3D) optimization design for an asymmetric cusp magnetic field in an MCZ single crystal furnace, which includes two portions of optimization design for both structural parameters of a magnetic field and specification parameters of coils.

The optimization design for structural parameters of a magnetic field mainly focuses on the influence on magnetic induction intensity when the number of layers in an upper part of coils and the number of layers in a lower part of coils are different, in order to determine the particular structure of an asymmetric cusp magnetic field. The object of optimization is to analyze the distributions of radial components and axial components of the magnetic field along a crucible wall so as to make the region at solid-liquid interface with a radial component of Br≧Brmin and an axial component of Bz≦Bzmax the widest.

The optimization design for structural parameters of the magnetic field is implemented in detail according to Step 1 and Step 2.

In Step 1, a 3D-model is established by using ANSYS an Ansys numerical analysis software, as shown in FIG. 1, which is carried out according to the following steps: defining relevant parameters of a magnetic field at first; then allocating unit property and material property of a model, in which air of thin layer inside the magnetic field and magnetic shield are divided by using an entity unit SOLID98, far-field air outside the magnetic field is divided by using INFIN47, and coils are modeled by using a micro-unit SOURCE36; establishing mesh for each region in an order of shield-air layer-far field, in particular, establishing mesh for the shield and the far field by using mapping, and establishing mesh for the air layer by using free mapping; and finally analyzing the solution of the model by applying boundary conditions to the model using a differential scalar potential (DSP) method among scalar potential methods. It should be noted that although the cusp magnetic field has an axial-symmetric structure about a crystal growth axis, an opening is formed in a cylindrical shield at a side of a back upright post of the single crystal furnace body to receive cooling water for coils, thus analysis should be made by modeling the whole magnetic rather than by three-dimensional modeling only a part of the magnetic field so as to reduce the amount of calculation; otherwise, the magnetic distribution cannot be really reflected. This step further includes applying magnetic marks to nodes at the outside boundary of the far field, and applying a parallel boundary conduction of magnetic force line to edges of the model. The applying of current load is represented by current density, that is, a current flowing per unit area.

Figure 2:
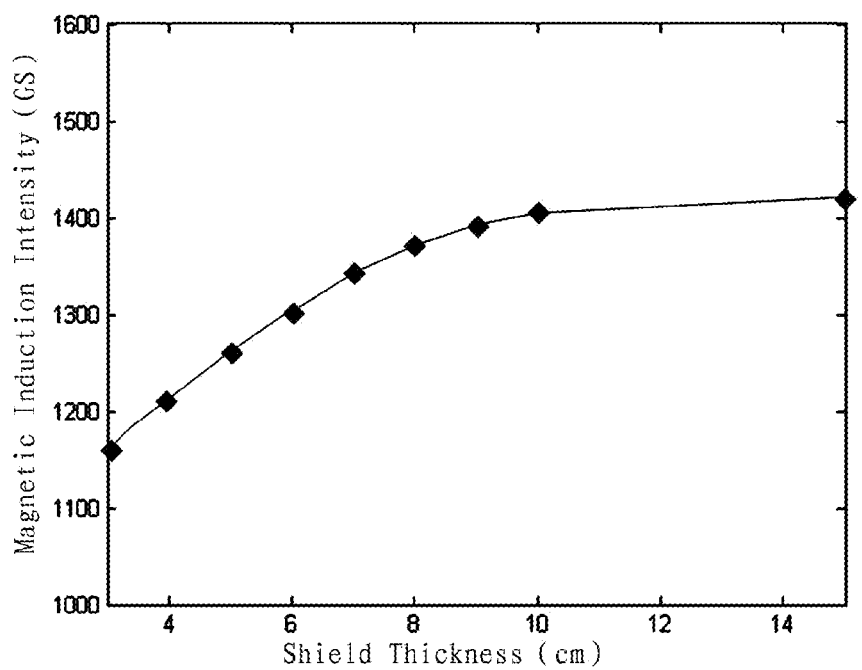
FIG. 2 is a graph showing a radial component of magnetic induction intensity varying with respect to thickness of a shield according to the present invention.
Figure 3:
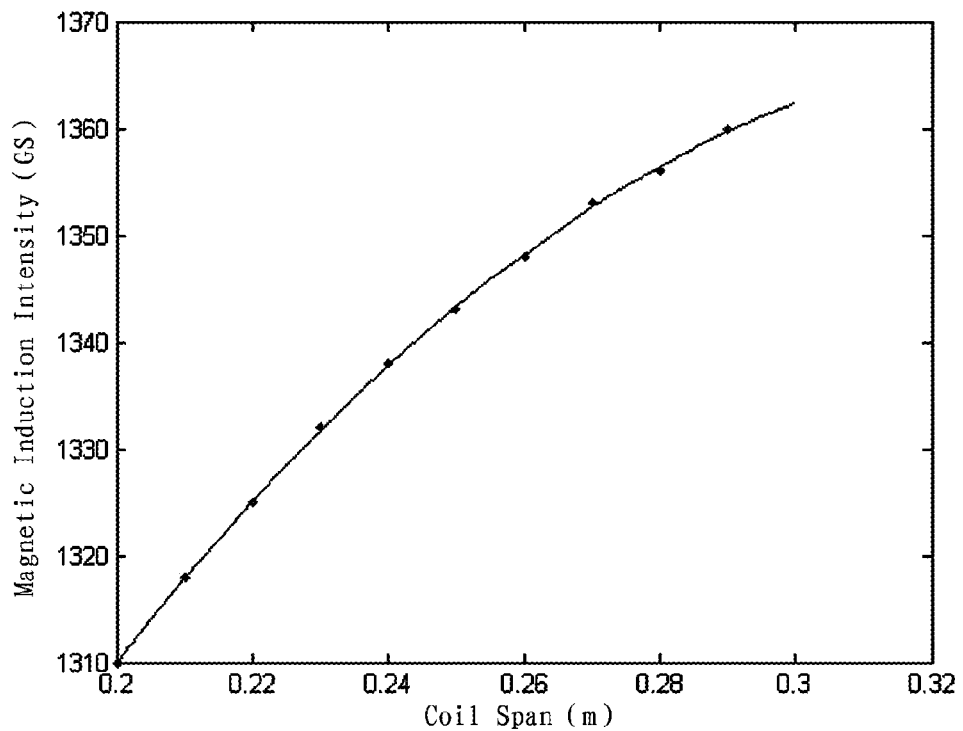
FIG. 3 is a graph showing a radial component of magnetic induction intensity varying with respect to coil span according to the present invention.
Figure 13:
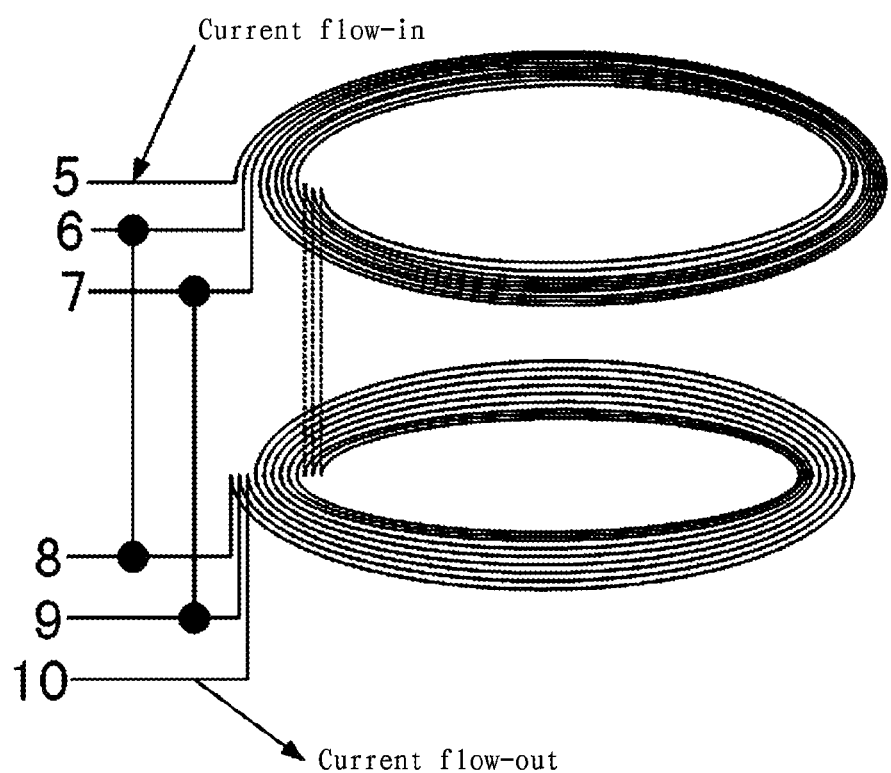
FIG. 13 is a schematic view of a connection method for current-carrying and water-through of a cusp magnetic field according to an embodiment of the present invention.

In Step 2, model parameters are changed, and the relationship of a magnetic induction intensity of the cusp magnetic field varying with respect to a span between upper and lower parts of coils, a transverse turns of coils, and a thickness of a shield are analyzed. It has been found from simulation calculation on the model that the magnetic induction intensity increases as the thickness of the shield increases, while the increasing rate thereof is increasingly decreased as the thickness of the shield increases. The thickness value where the increasing rate of the magnetic induction intensity is changed to be small from large is generally used as an optimization value, meanwhile, in consideration of such factors as body height limitation of the single crystal furnace, weight limitation of the magnetic field itself and the like, the variation of the radial component of the magnetic induction intensity with respect to the thickness of the shield is shown in FIG. 2. The magnetic induction intensity increases as the coil span increases, while the increasing rate thereof is increasingly decreased as the coil span increases. The variation of the radial component of the magnetic induction intensity with respect to the coil span is shown in FIG. 3 by taking a certain suitable value as the coil span while being limited similarly by the body height of the single crystal furnace and the weight of the magnetic field itself. The factors of the overall efficiency of the magnetic field, the connection of cooling water paths in the magnetic field and the like have to be considered when optimizing the number of transverse layers of the magnetic field. First, in the case that the electric current has a certain value and other structural parameters of the magnetic field are kept unchanged, efficiency per unit ampere turns is calculated by varying the transverse turns of coils in the magnetic field, and generally, the higher the efficiency is, the better it is. However, in the case that the total turns of coils has a certain value, the less the number of transverse layers is, the more the number of the longitudinal layers can be, resulting in an increased body height of the single crystal furnace. In the meantime, there are generally three of four cooling water paths in each group of magnetic field coils, thus the number of the transverse turns should be selected as a multiple of three or four in view of manufacturing process, and the connection schematic view of cooling water is shown in FIG. 13.

Provided that the magnetic field has a certain power (which is represented by $w=I^2R$, wherein I refers to a current flowing through coils in a power-on magnetic field, R refers to a resistance of the coils in the magnetic field), the numbers of longitudinal layers of coils in upper and lower parts of the magnetic field are determined by taking a common region with the magnetic induction intensity at a solid-liquid interface has both a radial component of Br≧Brmin and an axial component of Bz≦Bzmax being the widest as the optimization object. In the case of a certain power, by varying the numbers of longitudinal layers $N_1$ and $N_2$ in the upper and lower parts of coils (the resistance R of the coils in the magnetic field is decided by the turns) and the coil current I, respectively, widths of the common regions where the magnetic induction intensity at a solid-liquid interface has both a radial component of Br≧Brmin and an axial component of Bz≦Bzmax are calculated, and the parameters $N_1$, $N_2$ and I where the common region is the widest are selected, so that the numbers of the longitudinal layers of coils are determined to be $N_1 * N_2$.

The optimization design for specification parameters of the coils is implemented in detail according to Step i and Step ii.

Step i:

a. The relationship between the heat of the coils and the specification parameters of the coils is established so as to obtain a mathematical expression of a coil heat w1 and a cross-section area (i.e. a current-carrying area) of the coils as follows:

$$w1 = \frac{I^2 l}{s}\rho_0(1+at) \quad (1)$$

Wherein, I refers to a current of the coils powered-on, l refers to a total length of the coils, s refers to a cross-section area of the coils, $\rho_0$ refers to a resistivity at 0° C., a refers to a temperature coefficient of resistivity, and t refers to an actual temperature of copper pipe walls of the coils (since the temperatures of the copper pipe walls of the inlet and outlet of the coils in the cusp magnetic field are not equal, an average of the temperatures at the inlet and outlet can be taken, and if the water temperature at the inlet is 20 and the water temperature at the outlet is 40° C., t can be taken as 30° C.); I can be obtained by calculating the numbers of transverse and longitudinal layers of coils, and thus is a known quantity; after the total turns of the coils are determined, the current I capable of meeting a required magnetic induction intensity is also known, while $\rho_0$ and a are constants, both of which are known, thus only w1 is relevant to the current-carrying area s.

b. The relationship between heat transfer of the coils at the copper pipe walls and the specification parameters of the coils is established so as to obtain a mathematical expression of a copper pipe wall heat transfer w2 and a cross-section area of cooling water pipes of the coils as follows:

$$w2 = 0.023 \frac{\lambda A}{de}\left(\frac{Vde}{v}\right)^{0.8} Pr^{0.4} \Delta t \qquad (2)$$

In the above expression, λ refers to a heat conductivity of water, de refers to a characteristic size, A refers to a total heat transferring area of the copper pipe walls, V refers to an average flow velocity of fluid, v refers to a kinematic viscosity of the fluid, Pr refers to Prandtl number, Δt refers to temperature difference between the copper pipe walls and the cooling water. Among them, λ, v and Pr can be obtained by looking up tables, and A is a function of de, thus w2 is only relevant to de, V and Δt.

c. A mathematical expression among the amount of heat absorbed by cooling water w3 and the number of branches of cooling water paths n, the flow amount of cooling water $q_m$, the specific heat capacity of water c, the outlet water temperature t2, and the inlet water temperature t1 as follows:

$$w3 = q_m c(t2-t1) \cdot n \qquad (3)$$

In the above expression, $q_m$ refers to the flow amount of cooling water, c refers to the specific heat capacity of water, t2 refers to the water temperature at the outlet, t1 refers to the water temperature at the inlet, and n refers to the number of branches of cooling water paths.

Step ii: an optimization model of a system is established when w1=w2=w3, and the optimization object is as follows:

$$\min(w1) = \frac{I^2 l}{s}\rho_0(1+at) \qquad (4)$$

with constraint conditions of Δt+t2<40 and hf<20.

Wherein, Δt+t2 is the temperature of the copper pipe walls, and hf refers to the linear loss along the coils.

The optimization algorithms at steps a to c in Step 1 can be realized by virtue of the ANSYS numerical analysis software so as to optimize the specification parameters of the coils in the magnetic field.

Embodiment

By taking a TDR-120 type single crystal furnace with an outer diameter of a main furnace chamber being 1320 mm and an inner wall of crucible being 28 inches as an object, a structure of a cusp magnetic field and specification parameters of coils are optimized via a computer by using ANSYS numerical analysis software so as to obtain the region below a solid-liquid interface at the inner wall (the diameter thereof is 680 mm) of the crucible with a radial component of magnetic induction intensity being Br≧Brmin and an axial component thereof being Bz≦Bzmax, and to make the region with a radial component of Br≧Brmin and an axial component of Bz≦Bzmax as wide as possible, and to make the power consumption of the magnetic field to be minimum. By using the parameters obtained by the optimization method, a cusp magnetic field with upper and lower groups of coils being asymmetric and having an inner diameter of 1370 mm, an outer diameter of 1880 mm and a height of 1200 mm is constructed.

The optimization design for structural parameters of the asymmetric magnetic field can include the following steps:

Step 1: the inner diameter of the cusp magnetic field is determined to be 1370 mm according to the outer diameter of the main furnace chamber being 1320 mm, and the magnetic field is first set as having 20 layers of upper part of coils, 30 layers of upper part of coils, a coil span of 220 mm, a shield with a thickness of 65 mm, and a water-through area of 6 mm*6 mm, the coils having a cross-section of 14 mm*14 mm, and the number of transverse layers being 12 turns. A three-dimensional model for the cusp magnetic field is established by using the Anasys numerical analysis software, as shown in FIG. 1;

Step 2: analyzing the influence of each structural parameter of the magnetic field on the magnetic induction intensity.

(1) In the case that the electric current has a certain value and other structural parameters of the magnetic field are kept unchanged, the influence of the transverse turns of coils of the magnetic field on the magnetic induction intensity is analyzed by varying the transverse turns. FIG. 1 shows the influence of different transverse turns on the magnetic induction intensity. The transverse turns can be selected as 12 in view of process and magnetic efficiency.

TABLE 1

Influence of different number of transverse layers on the magnetic field

| Transverse layers | 8 | 9 | 12 | 15 |
|---|---|---|---|---|
| Magnetic induction intensity at the crucible wall (Gs) | 1037.8 | 1123.9 | 1324.9 | 1478.8 |
| Efficiency per unit ampere turns | 0.0025945 | 0.0024975 | 0.002206 | 0.00197 |

(2) In the case that the electric current has a certain value and other structural parameters of the magnetic field are kept unchanged, the influence of spans of upper and lower parts of coils in the magnetic field on the magnetic induction intensity is analyzed by varying the spans. FIG. 3 is a graph showing the influence of coil spans on the magnetic induction intensity. It can be seen from the graph that the variation of the spans of upper and lower parts of coils has less influence on the radial magnetic induction intensity at the crucible wall, thus the span of the coils can be taken as little as 220 mm.

(3) In the case that the electric current has a certain value and other structural parameters of the magnetic field are kept unchanged, the influence of thicknesses of shield of the magnetic field on the magnetic induction intensity is analyzed by varying the thicknesses. FIG. 2 is a graph showing the influence of the shield thickness on the magnetic induction intensity. It can be seen from the graph that the increasing of the radial magnetic induction intensity at the crucible wall is the largest as much as 40 Gs when the shield has a thickness in a range of 60 mm~70 mm, thus the thickness of the shield can be selected as 65 mm.

Figure 4:
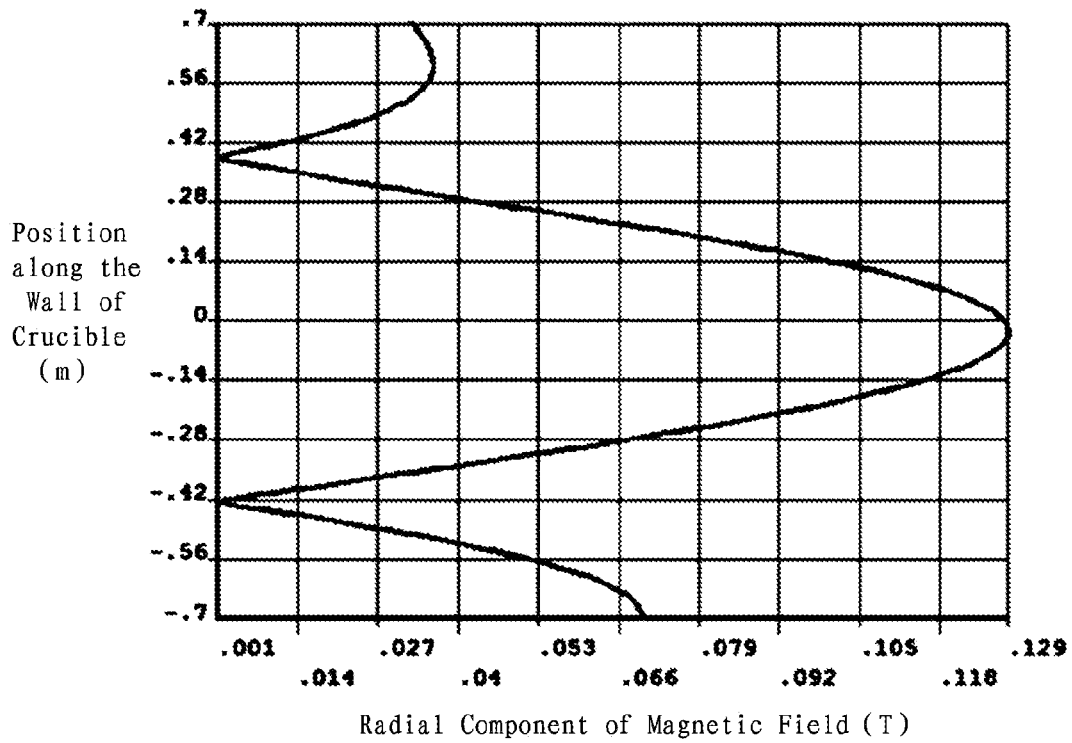
FIG. 4 is a graph showing radial components of a lower magnetic field distributed along a crucible wall, with the number of layers in upper and lower parts of coils being 20*30 and a current being 1000 A, according to an embodiment of the present invention.
Figure 5:
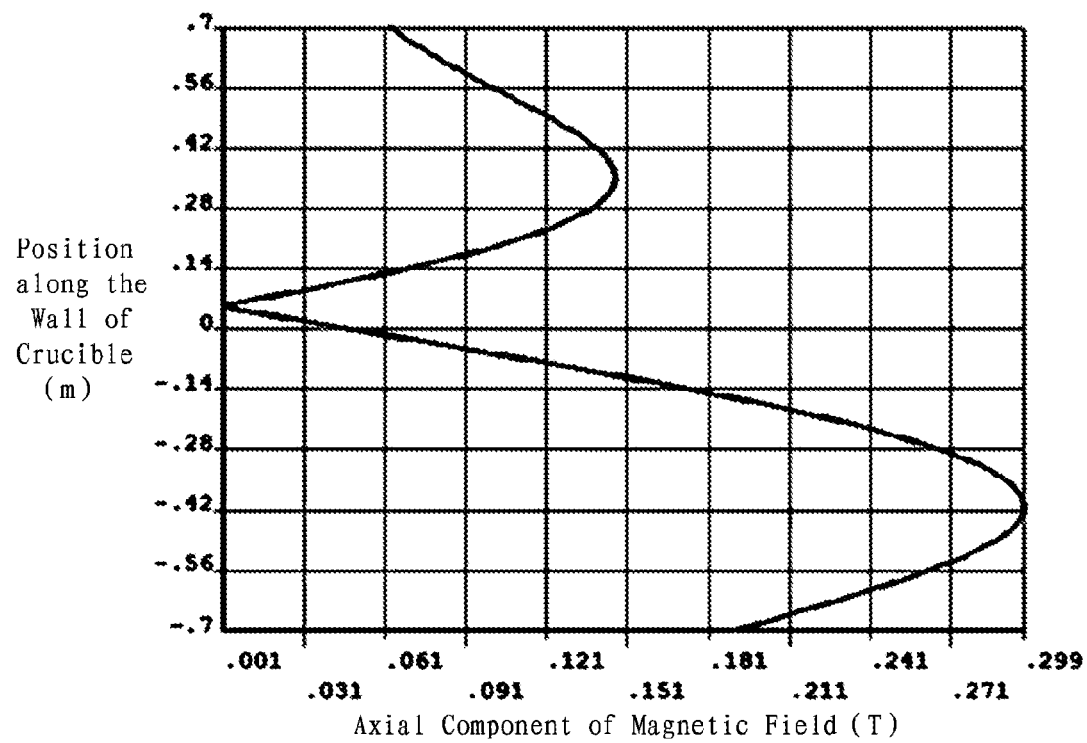
FIG. 5 is a graph showing axial components of a lower magnetic field distributed along a crucible wall, with the number of layers in upper and lower parts of coils being 20*30 and a current being 1000 A, according to the embodiment of the present invention.
Figure 6:
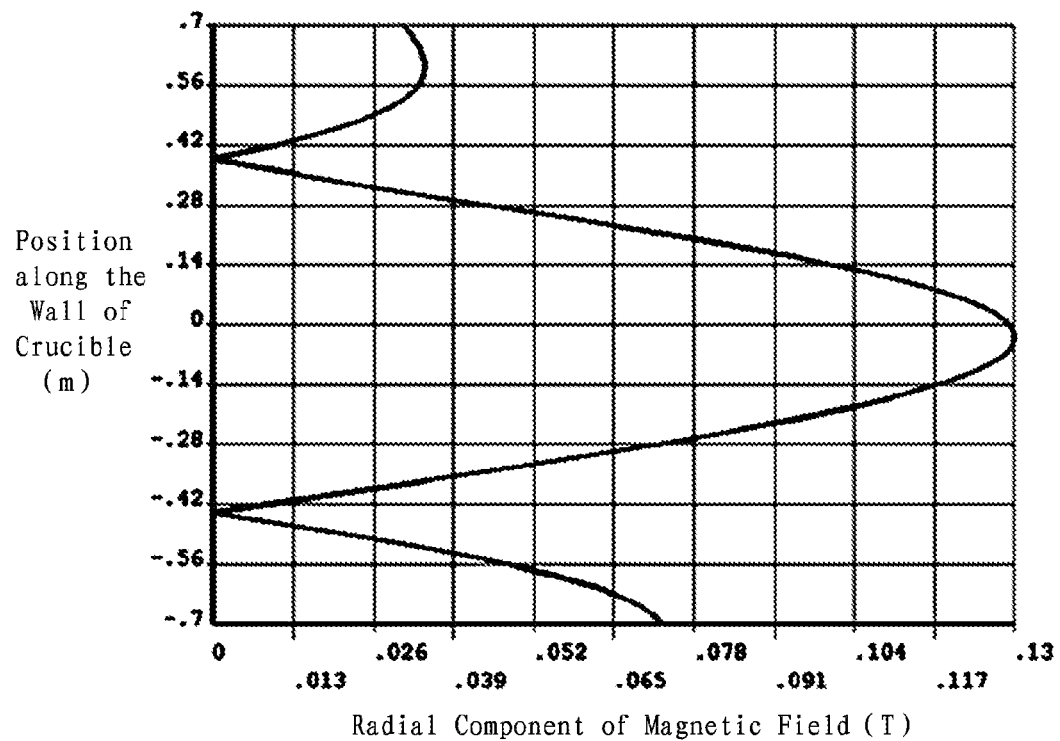
FIG. 6 is a graph showing radial components of a lower magnetic field, with the number of layers in upper and lower parts of coils being 20*32 and a current being 980 A, distributed along a crucible wall, according to an embodiment of the present invention.
Figure 7:
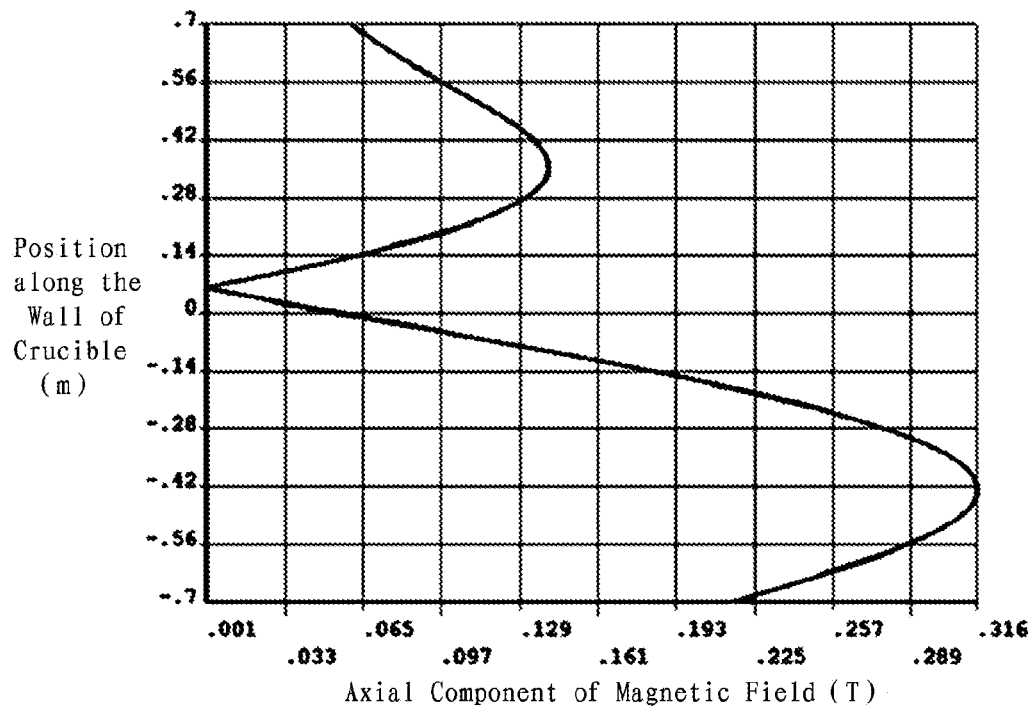
FIG. 7 is a graph showing axial components of a lower magnetic field distributed along a crucible wall, with the number of layers in upper and lower parts of coils being 20*32 and a current being 980 A, according to the embodiment of the present invention.
Figure 8:
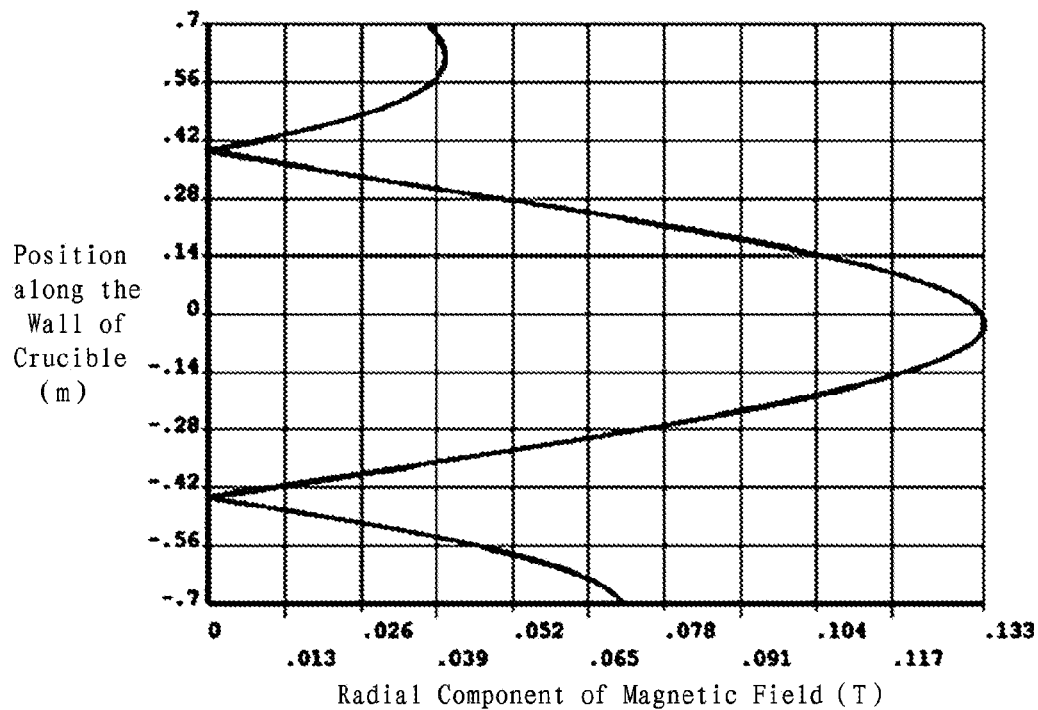
FIG. 8 is a graph showing radial components of a lower magnetic field distributed along a crucible wall, with the number of layers in upper and lower parts of coils being 22*32 and a current being 960 A, according to an embodiment of the present invention.
Figure 9:
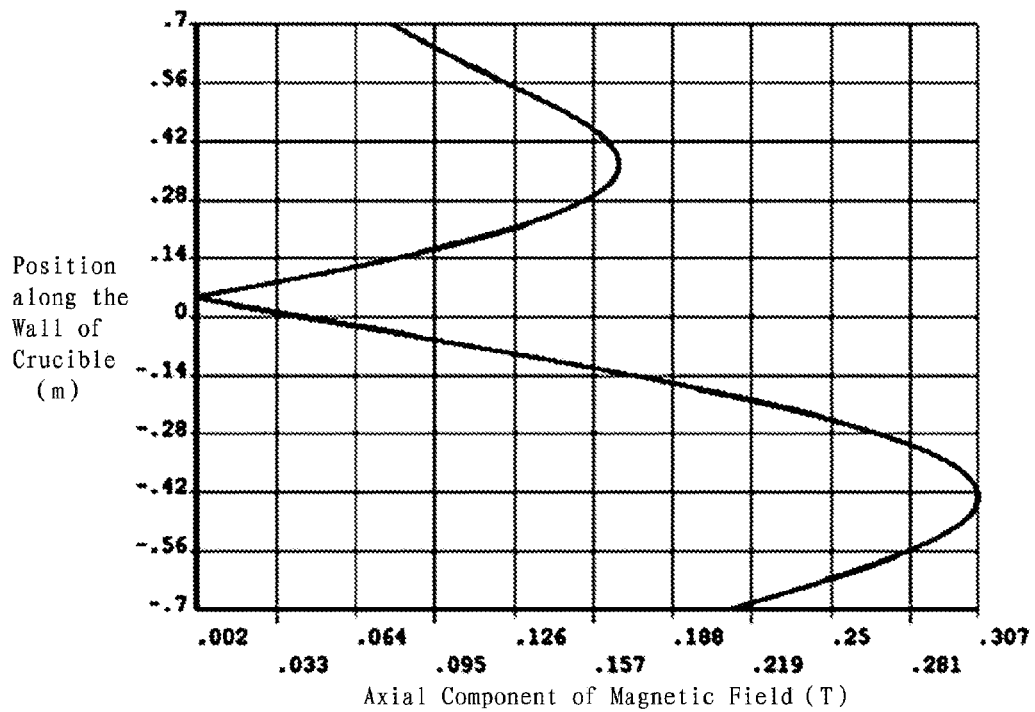
FIG. 9 is a graph showing axial components of a lower magnetic field distributed along a crucible wall, with the number of layers in upper and lower parts of coils being 22*32 and a current being 960 A, according to the embodiment of the present invention.
Figure 10:
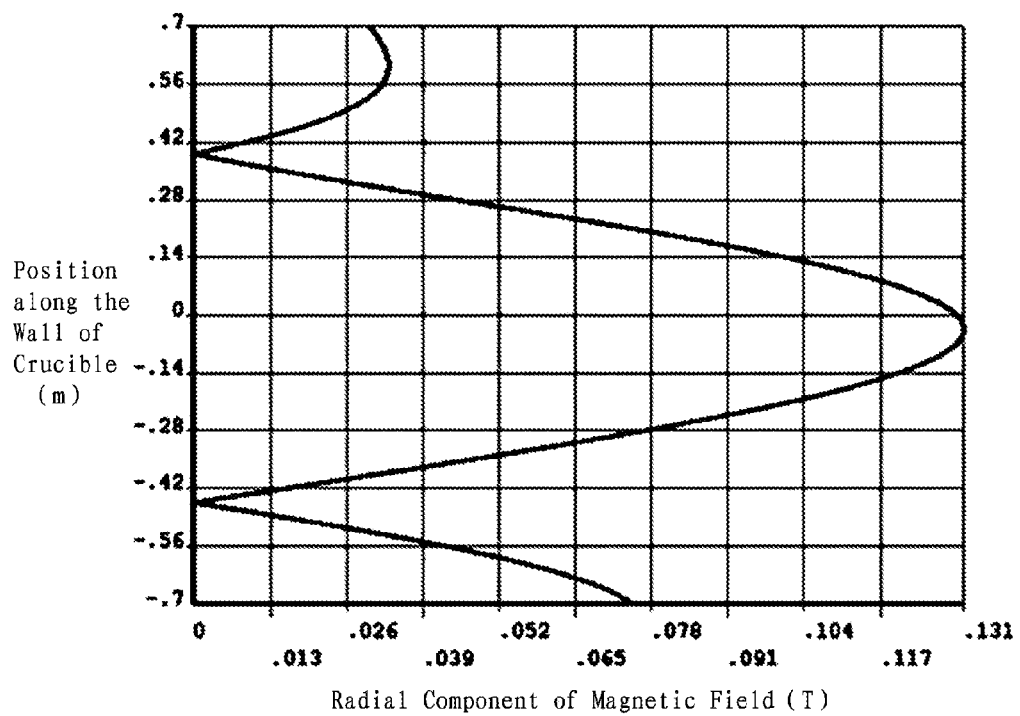
FIG. 10 is a graph showing radial components of a lower magnetic field distributed along a crucible wall, with the number of layers in upper and lower parts of coils being 20*34 and a current being 960 A, according to an embodiment of the present invention.
Figure 11:
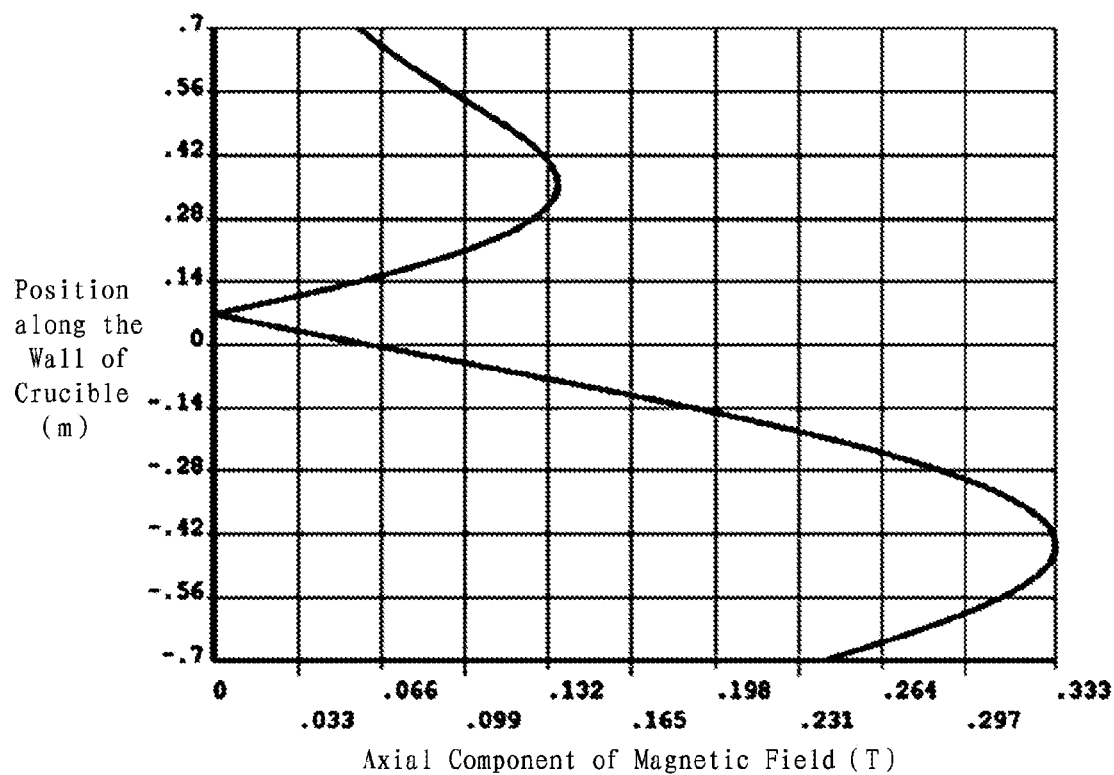
FIG. 11 is a graph showing axial components of a lower magnetic field distributed along a crucible wall, with the number of layers in upper and lower parts of coils being 20*34 and a current being 960 A, according to the embodiment of the present invention.

The power of the magnetic field can be represented by W=I²R, in which I refers to a current flowing through coils in a power-on magnetic field, R refers to a resistance of the coils in the magnetic field, and after the simulated analysis, the electric current is required to be approximately 1000 A if the radial component of the magnetic field at the crucible wall is up to 1200 Gs, when the number of the longitudinal layers of the upper and lower parts of coils is 20*30. Under a condition that the powers are the same, a width range where the radial component of the magnetic field at the crucible wall is larger than 1200 Gs and the axial component thereof is less than 200 Gs when the number of layers of the upper and lower parts of coils are 20*30 with a current of 1000 A, 20*32 with a current of 980 A, 22*32 with a current of 960 A, 20*34 with a current of 960 A, respectively. FIG. 4 is a graph showing radial components of the lower magnetic field distributed along the crucible wall, with the number of layers in upper and lower parts of coils being 20*30 and a current being 1000 A, in which the horizontal axis denotes radial components of the magnetic field, and the vertical axis denotes the positions along the crucible wall. FIG. 5 is a graph showing axial components of the above magnetic field distributed along the crucible wall. FIGS. 6 and 7 are graphs respectively showing radial components and axial components of a lower magnetic field distributed along the crucible wall, with the number of layers in upper and lower parts of coils being 20*32 and a current being 980 A. FIGS. 8 and 9 are graphs respectively showing radial components and axial components of a lower magnetic field distributed along the crucible wall, with the number of layers in upper and lower parts of coils being 22*32 and a current being 960 A. FIGS. 10 and 11 are graphs respectively showing radial components and axial components of a lower magnetic field distributed along the crucible wall, with the number of layers in upper and lower parts of coils being 20*34 and a current being 960 A. Table 2 shows the simulation results obtained by varying the number of layers of upper and lower parts of coils in the magnetic field with a certain power and other structural parameters of the magnetic field kept unchanged.

TABLE 2

Influence of the number of different longitudinal layers on the distribution of the magnetic field

| Current | 1000 A | 980 A | 960 A | 960 A |
|---|---|---|---|---|
| Upper coils | 20 | 20 | 22 | 20 |
| Lower coils | 30 | 32 | 32 | 34 |
| Region where Br ≧ 1200 Gs (m) | −0.112~0.064 | −0.128~0.068 | −0.138~0.087 | −0.141~0.071 |
| Region where Bz ≦ 200 Gs (m) | 0.032~0.076 | 0.04~0.084 | 0.024~0.068 | 0.045~0.092 |
| Common region (m) | 0.032~0.064 | 0.04~0.068 | 0.024~0.068 | 0.045~0.071 |
| Width of common region (mm) | 32 | 28 | 44 | 26 |

It can be seen that there is the largest common region of 44 mm with radial and axial components of the magnetic field at the crucible wall respectively being Br≧1200 Gs and Bz< 200 Gs when the number of layers of upper and lower parts of coils is taken as 22*32. Therefore, it can be determined that the number of layers of the upper and lower parts of coils is 22*32.

The optimization design for specification parameters of the coils is as follows.

Figure 12:
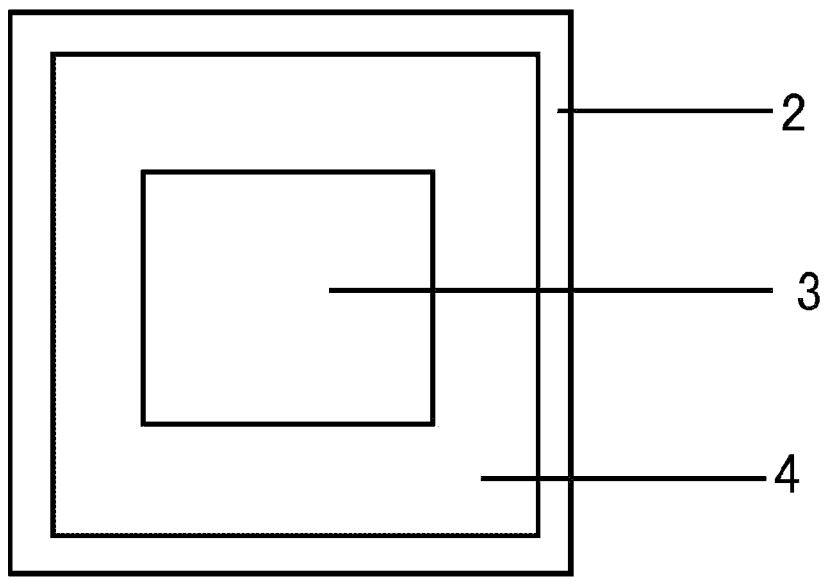
FIG. 12 is a schematic view of a cross-section for current-carrying and water-through of a cusp magnetic field according to an embodiment of the present invention.

Step i:

a. The relationship between the heat of the coils and the specification parameters of the coils is established. The coils have cross-sections as shown in FIG. 12. In the case that there are the same exciting currents and certain Cu pipes, the larger the current-section areas of the coils are, the smaller the resistance of the coils is, and the less the heat of the coils is, while the water-through area of the coils reduces, resulting in a problem of heat dissipation of the coils. Provided that the amount of heat generated by the coils is represented by w1, the following formula can be obtained based on basic law of electricity:

$$w1 = \frac{I^2 l}{s} \rho_0 (1 + at) \tag{5}$$

In the above formula, I refers to a current of the coils powered-on, l refers to a total length of the coils, s refers to a cross-section area of current-carrying portions, $\rho_0$ refers to a resistivity at 0° C., a refers to a temperature coefficient of resistivity, and t refers to an actual temperature of the copper pipe walls (since the temperatures of the copper pipe walls of the inlet and outlet of the coils in the cusp magnetic field are not equal, an average of the temperatures at the inlet and outlet can be taken, and if the water temperature at the inlet is 20 and the water temperature at the outlet is 40° C., t can be taken as 30° C.); l can be obtained by calculating the numbers of transverse and longitudinal layers of coils, and thus is a known quantity; after the total turns of the coils are determined, the current I capable of meeting a required magnetic induction intensity is also known (it is taken as 1000 A when the number of layers of upper and lower parts of coils is 20*30), while $\rho_0$ and a are constants, both of which are known, thus w1 is only relevant to the current-carrying area s.

b. The relationship between heat transfer of the coils at the copper pipe walls and the specification parameters of the coils is established. Based on relevant laws of thermodynamics, the relationship between a copper pipe wall heat transfer w2 and the specification parameters of the coils can be obtained. Nusselt number can be obtained by using Dittus-Boelter Equation so that the coefficient of heat transfer can be deduced, thus w2 can be expressed as follows:

$$w2 = 0.023 \frac{\lambda A}{de} \left(\frac{V de}{v}\right)^{0.8} P_r^{0.4} \Delta t \tag{6}$$

In the above expression, λ refers to a heat conductivity of water, de refers to a characteristic size, A refers to a total heat transferring area of the copper pipe walls, V refers to an average flow velocity of fluid, v refers to a kinematic viscosity of the fluid, Pr refers to Prandtl number, Δt refers to temperature difference between the copper pipe walls and the cooling water. Among them, λ, ν and Pr can be obtained by looking up tables, and A is a function of de, thus w2 is only relevant to de, V and Δt.

c. The amount of heat absorbed by cooling water is analyzed, i.e. the amount of heat taken by cooling water w3.

$$w3=q_m c(t2-t1)\cdot n \qquad (7)$$

In the above expression, $q_m$ refers to the flow amount of cooling water, c refers to the specific heat capacity of water, t2 refers to the water temperature at the outlet, t1 refers to the water temperature at the inlet, and n refers to the number of branches of cooling water paths in parallel coils. FIG. 13 is a schematic view of connecting a single coil carrying current and water paths, in which n is 3. Herein, the value of n is determined based on the number of transverse layers, and when the number of transverse layers of the Cusp coils is 12, the number of cooling water paths can be selected as three or four. The number of cooling water paths is selected as small as possible, which can reduce the difficulty in mounting coils. Here, n can be selected as 3 at first.

d. An optimization model of a system is established in consideration of constraint conditions. A copper pipe conducts heat in a manner of constant heat flux, and in this manner, the temperature of the copper pipe can be expressed as Δt+t2. Provided that the copper pipe can bear a highest temperature of 40° C., while ignoring local loss in cooling water paths, a friction coefficient λ can be calculated based on Blasius Equation so that friction loss can be expressed as follows:

$$h_f = \lambda \frac{l}{d} \frac{v^2}{2g} \qquad (8)$$

Step ii: A model can be established as follows based on the formulas (6)-(9) and a balance equation w1=w2=w3 by taking a head loss in cooling water pipes less than 20 m when designing.

$$\text{Objective function: } \min(w1) = \frac{I^2 l}{s}\rho_0(1+at) \qquad (9)$$

with constraint conditions of Δt+t2<40 and hf<20.

By means of the ANSYS numerical analysis software, an optimization algorithms is programmed with an objective function of w1, a design variable of length of sides of the cross-section of cooling water pipes, and a status variable of temperature of the copper pipe walls so that the temperature of the copper pipe walls is lower than 40 while defining the pressure of the water pipes within 0.2 MPa (at this time, the head loss is correspondingly 20 m). Through the optimization analysis, when the cross-section area of the coils is 14 mm* 14 mm, and the branches of cooling water paths are three, the temperature of the copper pipe walls is 44° C., slightly higher. If the cooling water paths are changed to 4 branches, the length of sides of the optimal cross-section is 5.13 mm through the optimization analysis, at this time, the temperature of the copper pipe walls is 38° C., the flow velocity of cooling water is 1.45 m/s, and the head loss is 19.5 m, which satisfies the constraint conditions. Finally, it is determined that the coils are made of a square pipe having a length of side of 14 mm with a water-through square pipe having the length of sides of 5 mm in the center thereof, so that the power of single coil can be decreased to 13.2 kw. Thus, the flow velocity of cooling water can be increased, and the temperature of the copper pipe walls can be reduced, thereby being capable of further reducing the power. The optimal coil specification parameters can be thus obtained.

What is claimed is:

1. A method of constructing electrical coils for generating an asymmetric cusp magnetic field within a single crystal furnace, the method comprising:

establishing a first mathematical expression of electrical coil heat as:

$$w1 = \frac{I^2 l}{s}\rho_0(1+at),$$

where I is a current of the coils, l is the total length of the coils, s is the cross-sectional area of the coils, $p_0$ is the resistivity of the coils, a is a temperature coefficient of resistivity, and t is the temperature of copper pipe walls of the coils;

establishing a second mathematical expression of heat transfer at the copper pipe walls as:

$$w2 = 0.023\frac{\lambda A}{de}\left(\frac{Vde}{v}\right)^{0.8} Pr^{0.4}\Delta t,$$

where de is a characteristic size, V is an average flow velocity of cooling water, Δt is the temperature difference between the copper pipe walls and the cooling water, λ is the heat conductivity of the cooling water, A is the total heat transferring area of the copper pipe walls, ν is the kinematic viscosity of the cooling water, and Pr is a Prandtl number;

establishing a third mathematical expression of heat absorbed by the cooling water as follows:

$$w3=q_m c(t2-t1)\cdot n,$$

where $q_m$ is the amount of cooling water flow, c is the specific heat capacity of the cooling water, t2 is the water temperature at a cooling water outlet, t1 is the water temperature at a cooling water inlet, and n is the number of cooling water paths for the copper pipes;

determining, with a processor, values for parameters s and l of the coils for which a minimum value of w1 satisfies the relation w1=w2=w3, Δt+t2<40 and hf<20, where Δt+t2 is the temperature of the copper pipe walls and hf is the linear loss along the coils; and constructing coils in accordance with the values determined for the parameters s and l.

* * * * *